(12) United States Patent
Wu et al.

(10) Patent No.: US 12,278,487 B2
(45) Date of Patent: Apr. 15, 2025

(54) ESD PROTECTION CIRCUIT, DRIVING CIRCUIT, PRE-DRIVING CIRCUIT AND IC LAYOUT THEREOF

(71) Applicant: Realtek Semiconductor Corp., HsinChu (TW)

(72) Inventors: Han-Hsin Wu, HsinChu (TW); Tay-Her Tsaur, HsinChu (TW); Yen-Wei Liu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 204 days.

(21) Appl. No.: 17/873,101

(22) Filed: Jul. 25, 2022

(65) Prior Publication Data

US 2023/0034030 A1 Feb. 2, 2023

(30) Foreign Application Priority Data

Jul. 27, 2021 (TW) .................................. 110127529

(51) Int. Cl.
*H02H 9/04* (2006.01)

(52) U.S. Cl.
CPC .................................. *H02H 9/046* (2013.01)

(58) Field of Classification Search
CPC .. H02H 3/20; H02H 1/0007; H03F 2200/441; H03F 2200/444; H03F 1/52; H03G 11/02
USPC .......................................................... 361/56
See application file for complete search history.

(56) References Cited

U.S. PATENT DOCUMENTS

| | | | | |
|---|---|---|---|---|
| 6,757,147 | B1 * | 6/2004 | Tong | H02H 9/046 361/111 |
| 7,372,679 | B1 * | 5/2008 | Ho | H02H 9/046 361/111 |
| 7,986,171 | B2 * | 7/2011 | Wang | H03K 19/0013 327/108 |
| 8,212,536 | B2 | 7/2012 | Burns | |
| 8,797,009 | B2 | 8/2014 | Oddoart | |
| 9,484,897 | B2 * | 11/2016 | Green | H03K 17/687 |
| 9,612,615 | B2 | 4/2017 | Lin | |
| 9,721,941 | B2 * | 8/2017 | Hwang | H10D 64/516 |
| 9,831,867 | B1 * | 11/2017 | Kinzer | H03K 19/017509 |
| 10,348,301 | B2 * | 7/2019 | Lee | H03K 19/01742 |
| 11,677,237 | B2 * | 6/2023 | Albertini | H02M 1/32 361/56 |
| 12,095,520 | B2 * | 9/2024 | Gupta | G06F 13/4282 |
| 2007/0014061 | A1 * | 1/2007 | Chang | H02H 9/046 361/56 |
| 2011/0148368 | A1 * | 6/2011 | Burns | H02M 1/088 323/225 |
| 2012/0229102 | A1 | 9/2012 | Burns | |
| 2012/0300349 | A1 * | 11/2012 | Abou-Khalil | H02H 9/046 716/102 |
| 2014/0092507 | A1 * | 4/2014 | Lefferts | H02H 9/046 361/56 |

(Continued)

FOREIGN PATENT DOCUMENTS

| | | | | |
|---|---|---|---|---|
| CN | 1205718 | C | 6/2005 | |
| CN | 111355226 | A * | 6/2020 | ......... H01L 27/0251 |
| CN | 114552553 | A * | 5/2022 | ......... H01L 27/0251 |

*Primary Examiner* — Dharti H Patel
(74) *Attorney, Agent, or Firm* — Winston Hsu

(57) ABSTRACT

An IC layout of a pre-driving circuit, comprising: a plurality of type one transistor regions, having a density smaller than a predetermined level; and a type two bulk region, surrounding the type one transistor regions.

7 Claims, 6 Drawing Sheets

(56) References Cited

U.S. PATENT DOCUMENTS

| | | | |
|---|---|---|---|
| 2014/0268441 A1* | 9/2014 | Mallikarjunaswamy | ................... H02H 3/44 361/56 |
| 2015/0062761 A1* | 3/2015 | Chen | ...................... H02H 9/046 327/333 |
| 2016/0056625 A1* | 2/2016 | Tsaur | ..................... H02H 9/045 361/56 |
| 2016/0285454 A1 | 9/2016 | Gupta | |
| 2016/0372453 A1* | 12/2016 | Suzuki | ................. H10D 89/813 |
| 2017/0125085 A1* | 5/2017 | Kim | ..................... H10D 89/819 |
| 2018/0026440 A1* | 1/2018 | Zhao | .................... H10D 89/819 361/56 |
| 2021/0013714 A1* | 1/2021 | Huang | ................... H02H 9/046 |
| 2021/0265337 A1* | 8/2021 | Hwang | ................ H10D 64/516 |
| 2021/0313801 A1* | 10/2021 | Albertini | ............. H02M 1/0006 |
| 2022/0057824 A1* | 2/2022 | Dey | .......................... G05F 3/30 |
| 2022/0115865 A1* | 4/2022 | Liao | ..................... H10D 89/811 |
| 2022/0158445 A1* | 5/2022 | Liao | ....................... H02H 9/046 |
| 2022/0231686 A1* | 7/2022 | Lee | ................ H03K 19/018521 |
| 2024/0113710 A1* | 4/2024 | Sanchez | ........... G01R 31/31713 |

\* cited by examiner

ESD PROTECTION CIRCUIT, DRIVING CIRCUIT, PRE-DRIVING CIRCUIT AND IC LAYOUT THEREOF

BACKGROUND OF THE INVENTION

1. Field of the Invention

The present invention relates to an ESD (electrostatic discharge) protection circuit, a driving circuit, a pre-driving circuit and an IC layout thereof, and particularly relates to an ESD protection circuit, a driving circuit, a pre-driving circuit and an IC layout, which can enhance the voltage endurance, or the circuit stability.

2. Description of the Prior Art

With the advancement of science and technology, IC (Integrated Circuit) functions become more and more powerful, and circuits become more and more complex. However, with the complexity of circuits and the miniaturization of components, the voltage endurance of the circuit components in the ESD protection circuit and the circuit stability of the output stage circuit have become important considerations when designing ICs.

Therefore, a new circuit design mechanism is needed to improve the voltage endurance of the circuit components in the ESD protection circuit and the circuit stability of the output stage circuit.

SUMMARY OF THE INVENTION

Therefore, one objective of the present invention is to provide an ESD protection circuit, which can increase a voltage endurance of components in the ESD protection circuit.

Another objective of the present invention is to provide a pre-driving circuit, which has a better stability.

One embodiment of the present invention discloses an ESD protection circuit, comprising: an RC circuit; a protection transistor electrically coupled to a first voltage source and a second voltage source and configured to control a conductive path between the first voltage source and the second voltage source according to a control voltage, a second voltage provided by the second voltage source being lower than a first voltage provided by the first voltage source; and an NOR gate electrically coupled between the RC circuit and the protection transistor, and configured to provide the control voltage according to an output of the RC circuit and a predetermined voltage.

Another embodiment of the present invention discloses: An IC layout of a pre-driving circuit, comprising: a plurality of type one transistor regions, having a density smaller than a predetermined level; and a type two bulk region, surrounding the type one transistor regions.

Still another embodiment of the present invention discloses: A pre-driving circuit, comprising: a voltage level transforming circuit, configured to transform a first input voltage to a first transferred voltage, or to transform a second input voltage to a second transferred voltage, wherein the first input voltage is higher than the second input voltage, and the second transformed voltages than the first transferred voltage; and a driving power enhancement circuit, comprising at least one inverter, wherein the inverter operates at the first input voltage and the second transferred voltage, or operates at the first transformed voltage and the second input voltage.

In view of above-mentioned embodiments, the voltage endurance of the circuit components of the ESD protection circuit, and the circuit stability of the pre-driving circuit, the driving circuit or the overall output stage circuit can be enhanced, so that the problems in the prior art can be improved.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Please note, the term "first", "second", "third" in following descriptions are only for the purpose of distinguishing different one components, and do not mean the sequence of the components. For example, a first device and a second device only mean these devices can have the same structure but are different devices.

Figure 1:
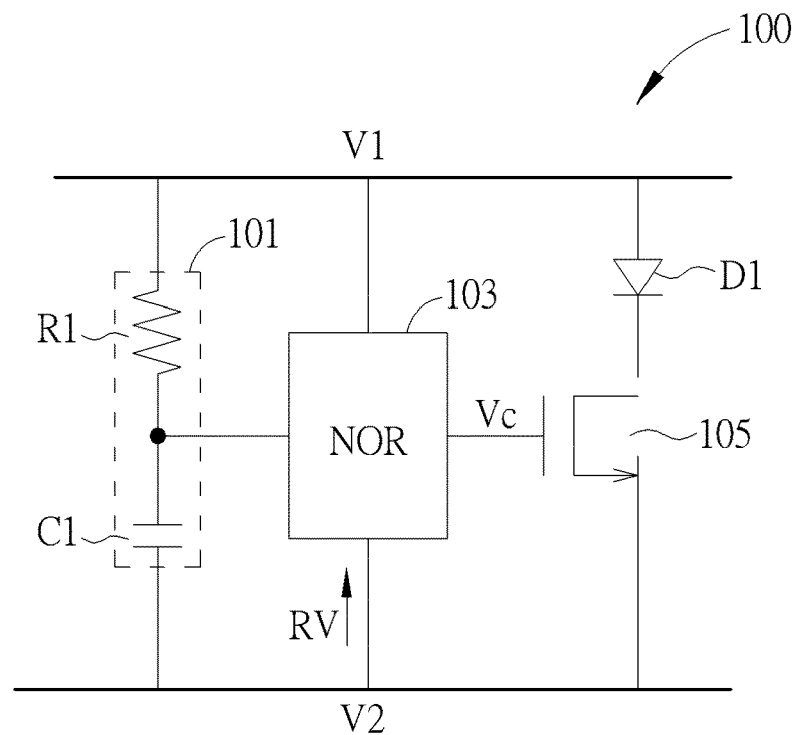
FIG. 1 is a circuit diagram illustrating an ESD protection circuit according to one embodiment of the present invention.

FIG. 1 is a circuit diagram illustrating an ESD protection circuit according to one embodiment of the present invention. As illustrated in FIG. 1, the ESD protection circuit 100 comprises an RC (Resistor-Capacitor) circuit 101, a NOR gate 103, and a protection transistor 105. The protection transistor 105 is electrically coupled to a first voltage source and a second voltage source. A second voltage V2 provided by the second voltage source is lower than a first voltage V1 provided by the first voltage source. In one embodiment, the second voltage V2 is a ground voltage. The protection transistor 105 is configured to control a conductive path between the first voltage source and the second voltage source according to a control voltage Vc. That is, the protection transistor 105 is turned on (conductive) or turned off (non-conductive) according to the control voltage Vc. The NOR gate 103 is electrically coupled between the RC circuit 101 and the protection transistor 105, for providing a control voltage Vc according to a predetermined voltage PV and the output of the RC circuit 101. In one embodiment, the RC circuit 101 comprises a resistor R1 and a capacitor C1 as illustrated in FIG. 1, and the protection transistor 105 is an NMOS (N type metal oxide semiconductor field effect transistor), but not limited.

The output of the RC circuit 101 changes when an ESD event occurs. Therefore, the NOR gate 103 turns on the protection transistor 105 to provide a current path to the large current caused by the ESD event. The conventional ESD protection circuit usually uses an inverter to turn on the protection transistor 105 according to the ESD event. However, when the IC using the ESD protection circuit 100 starts to operate to quickly charge the capacitor in the RC circuit 101, the output of the inverter may be pulled up thereby the protection transistor 105 may be wrongly turned on. Using the NOR gate 103 to receive the predetermined voltage PV as shown in the present invention can provide a stable output, which can ensure that the protection transistor 105 will not be wrongly turned and can solve this problem. In addition, in order to further increase the voltage difference between the first voltage V1 and the second voltage V2 that the protection transistor 105 can withstand, in one embodiment, the protection transistor 105 is connected in series with a voltage down component, so that the voltage down component reduces the voltage received by the protection transistor 105 thus can reduce the voltage difference directly received by the protection transistor 105. In one embodiment, the voltage down component is the diode D1 illustrated in FIG. 1, but it is not limited. The voltage down component can also be a transistor such as a MOS or a BJT (bipolar junction transistor).

Figure 2:
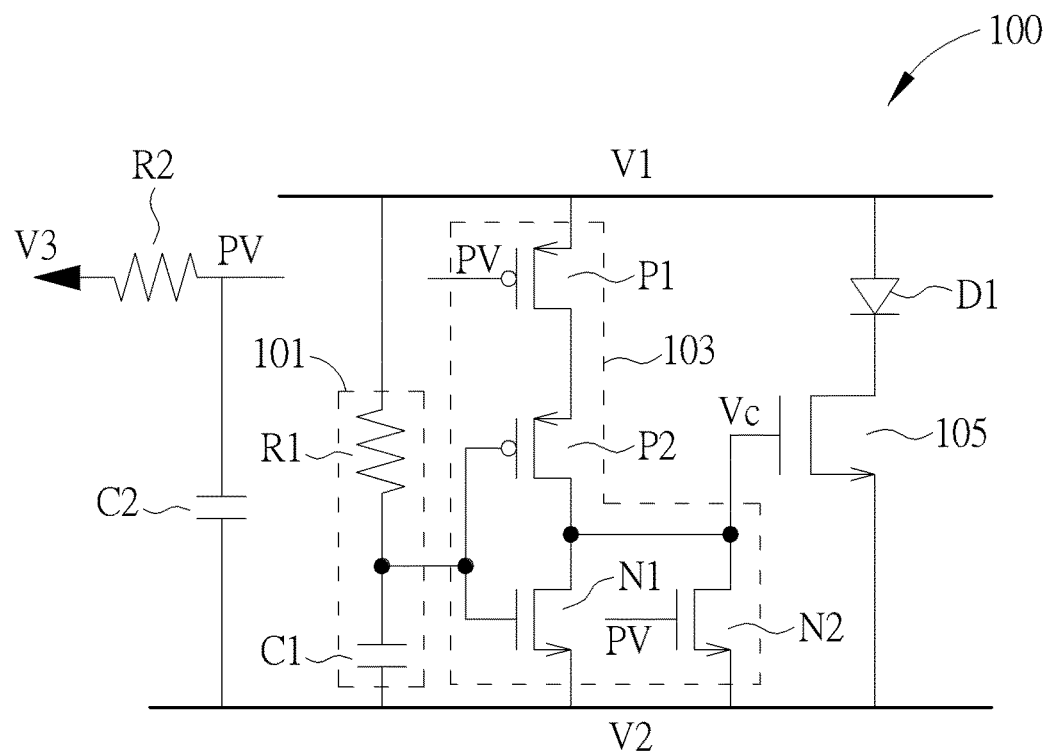
FIG. 2 is a circuit diagram illustrating a detail circuit of the ESD protection circuit illustrated in FIG. 1.

FIG. 2 is a circuit diagram illustrating a detail circuit of the ESD protection circuit illustrated in FIG. 1. As illustrated in FIG. 2, the NOR gate 103 comprises a first NMOS N1, a second NMOS N2, a first PMOS P1, and a second PMOS P2. Details of the connections between the first NMOS N1, the second NMOS N2, the first PMOS P1, the second PMOS P2 and other circuits, and the relations between the received signals, are described for more detail in FIG. 2.

The transistors of the protection transistor 105 in FIG. 2 can be replaced by other transistors to achieve the same function. For example, it can be replaced by PMOS or other different types of BJT to achieve the same effect. Therefore, the NOR gate 103 in FIG. 2 can be represented as comprising the following components: a first type one transistor (e.g., first NMOS N1) electrically coupled to the second voltage source (e.g., the voltage source for providing V2), the protection transistor 105, wherein a control terminal (e.g., a gate terminal) of the first type one transistor is electrically coupled to the RC circuit 101; a second type one transistor (e.g., the second NMOS N2) electrically coupled to the second voltage source, the protection transistor 105 and the first type one transistor, wherein a control terminal (e.g., a gate terminal) of the second type one transistor is configured to receive the predetermined voltage PV; a first type two transistor (e.g., first PMOS P1) electrically coupled to the first voltage source (e.g., the voltage source for providing V1), wherein a control terminal of the first type two transistor is configured to receive the predetermined voltage PV; and a second type two transistor (e.g., second PMOS P2) electrically coupled to the first type one transistor, the second type one transistor, the first type two transistor and the protection transistor, wherein a control terminal (e.g., a gate terminal) of the second type two transistor is electrically coupled to the RC circuit 101 and the control terminal of the first type one transistor. In the embodiment of FIG. 2, the type one transistor is NMOS and the type one transistor is a PMOS. In another embodiment, the type one transistor is a PMOS and the type two transistor is an NMOS.

In addition, in the embodiment of FIG. 2, the ESD protection circuit 100 further comprises a resistor R2 and a capacitor C2. The predetermined voltage PV is generated by coupling the resistor R2 and the capacitor C2 to the voltage V3, but the predetermined voltage PV can also be produced in other ways.

Figure 3:
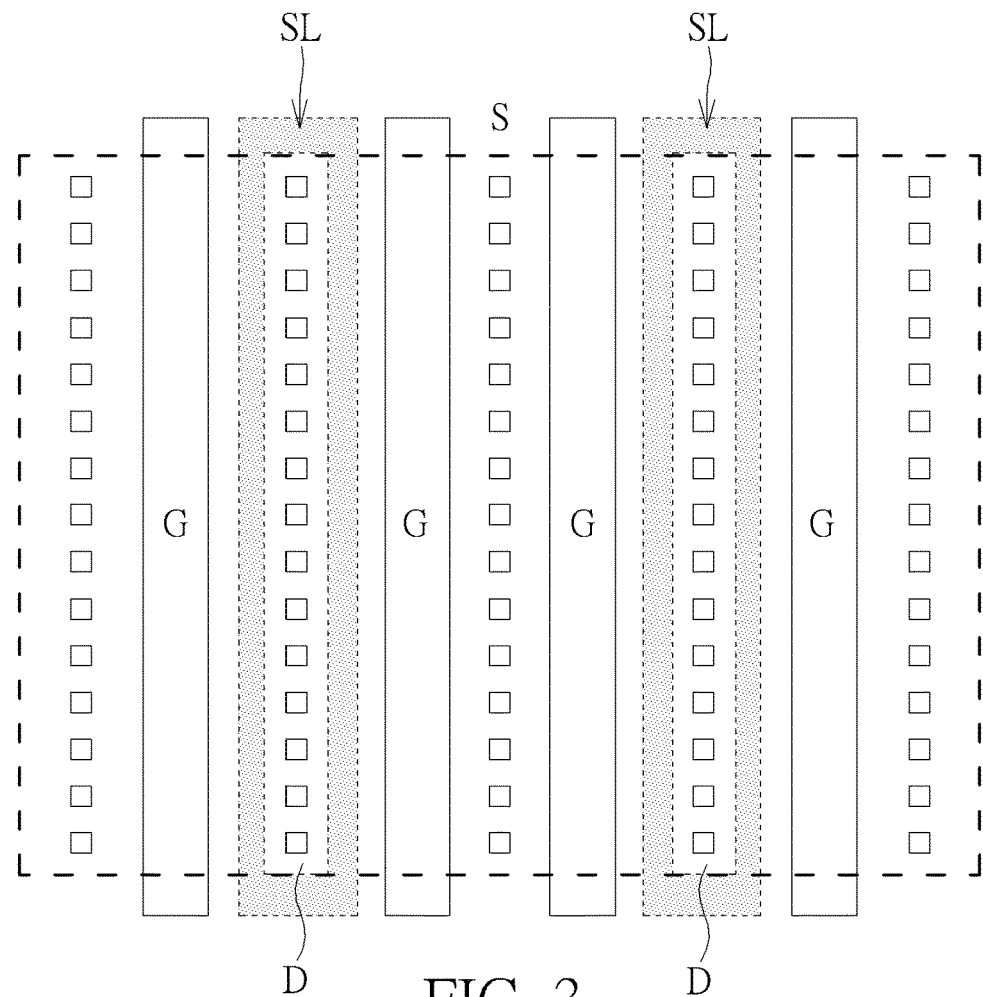
FIG. 3 is a schematic diagram illustrating an IC layout of the ESD protection circuit illustrated in FIG. 1.

The present invention also provides an IC (integrated circuit) layout of the ESD protection circuit to improve the voltage endurance of the protection transistor 105. FIG. 3 is a schematic diagram illustrating an IC layout of the ESD protection circuit illustrated in FIG. 1. In the embodiment of FIG. 3, the protection transistor 105 is an NMOS for an example of illustration, but the concept disclosed in the embodiment of FIG. 3 can be applied to other types of transistors. As illustrated in FIG. 3, the resistance layer SL is provided on the drain region D of the protection transistor 105. The resistance layer SL may cover the entire drain region D or only partial of the drain region D. The resistance layer SL can provide resistance, thereby increasing the resistance of the protection transistor 105, and therefore improves the voltage endurance of the protection transistor 105. The resistance layer SL can be a Silicide Blocking Layer (SAB) or any material that can provide resistance.

Figure 4:
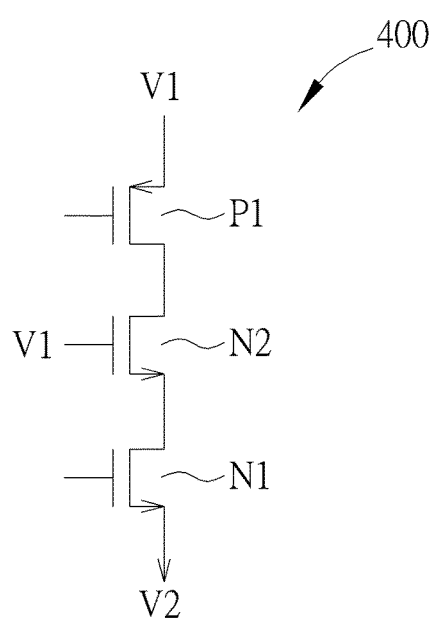
FIG. 4 is a circuit diagram illustrating a driving circuit according to one embodiment of the present invention.

In addition to the ESD protection circuit, the present invention also provides improvement to a driving circuit. FIG. 4 is a circuit diagram illustrating a driving circuit 400 according to one embodiment of the present invention. As illustrated in FIG. 4, the driving circuit 400 comprises a first NMOS N1, a second NMOS N2, and a first PMOS P1. The first PMOS P1 is electrically coupled to a first voltage source that provides a first voltage V1, and the first NMOS N1 is electrically coupled to a second voltage source that provides a second voltage V2. The second NMOS N2 is electrically coupled between the first PMOS P1 and the first NMOS N1, and its gate terminal receives the first voltage V1. The first voltage V1 is higher than the second voltage V2. In one embodiment, the second voltage V2 is a ground voltage.

In the prior art, the driving circuit 400 only comprises the first NMOS N1 and the first PMOS P1. In such case, the drain terminal and the gate terminal of the first NMOS N1 may have parasitic capacitance. Therefore, when the voltage at the drain of the first NMOS N1 increases instantaneously, the voltage at the gate terminal of the first NMOS N1 also increases instantaneously. In this situation, the break down voltage of the first NMOS N1 is easily exceeded, so the first NMOS N1 is easily damaged and the IC is correspondingly damaged. In the embodiment of FIG. 4 of the present invention, the driving circuit 400 further comprises a second NMOS N2 whose gate terminal receives a fixed first voltage V1. Therefore, even if the voltage at the drain terminal of the second NMOS N2 increases instantaneously, the first NMOS N1 and the second NMOS N2 do not have the problems of the conventional driving circuit. By this way, the stability of the circuit can be increased.

Please note, the transistors of the driving circuit 400 in FIG. 4 can be replaced by other transistors to achieve the same effect. For example, in one embodiment, the first NMOS N1 and the second NMOS N2 are replaced by PMOS, and the first PMOS P1 is replaced by NMOS. Or each is replaced by a different type of BJT. Therefore, the driving circuit 400 in FIG. 4 can be represented as comprising the following components: a first type one transistor (e.g., the first NMOS N1) electrically coupled to a second voltage source (e.g., the voltage source providing V2); a second type one transistor (e.g., the second NMOS N2) electrically coupled to the first type one transistor in series, and a control terminal (e.g., a gate terminal) of the second type one transistor is electrically coupled to the first voltage source; and a first type two transistor (e.g., the first PMOS P1) electrically coupled between the first voltage source (e.g., a voltage source providing V1) and the second type one transistor. In the embodiment of FIG. 4, the first type transistor is an NMOS and the second type transistor is a PMOS. In another embodiment, the first type transistor is a PMOS and the second type transistor is an NMOS.

Figure 5:
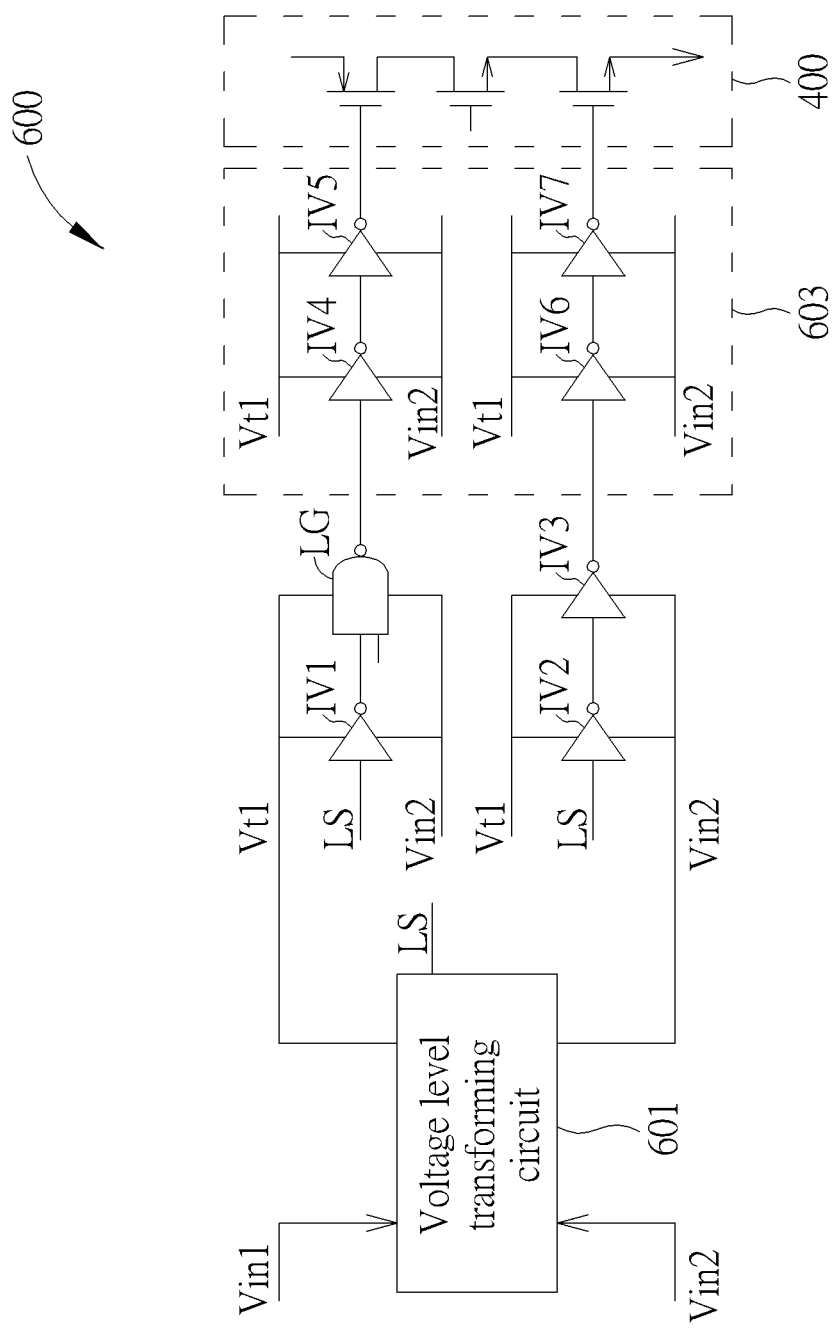
FIG. 5 and FIG. 6 are circuit diagrams illustrating pre-driving circuits according to different embodiments of the present invention.
Figure 6:
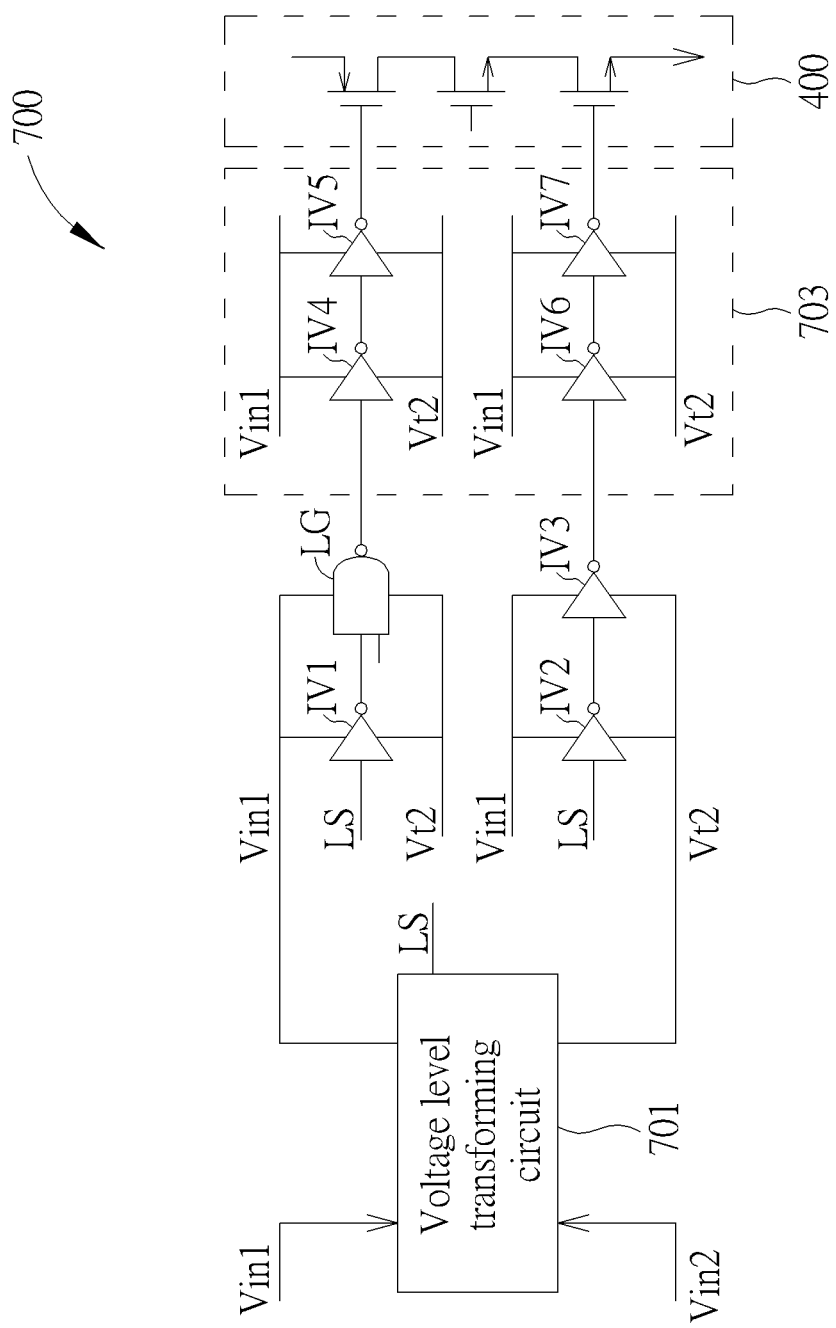

In addition to the driving circuit described in FIG. 4, the present invention also provides improvement for a pre-driving circuit. FIG. 5 and FIG. 6 are circuit diagrams illustrating pre-driving circuits according to different embodiments of the present invention. As illustrated in FIG. 5, the pre-driving circuit 600 comprises a voltage level transforming circuit 601 and a driving power enhancement circuit 603. The voltage level transforming circuit 601 is configured to transform a first input voltage Vin1 to a first transformed voltage Vt1 without transforming the second input voltage Vin2. The first input voltage Vin1 is higher than the second input voltage Vin2. In one embodiment, the second input voltage Vin2 is a ground voltage. Moreover, the driving power enhancement circuit 603 can be electrically coupled to the driving circuit 400 illustrated in FIG. 4. The pre-driving circuit 600 and the driving circuit 400 can be regarded as an output stage circuit.

The driving power enhancement circuit 603 comprises inverters IV4-IV7, which operate at the first transformed voltage Vt1 and the second input voltage Vin2. In one embodiment, in addition to the voltage level transforming circuit 601 and the driving power enhancement circuit 603, the pre-driving circuit 600 may further comprise other inverters IV1, IV2 and a logic gate LG1. The inverters IV1, IV2 and the logic gate LG1 can operate at the first transformed voltage Vt1 and the second input voltage Vin2. The inverters IV1, IV2 and the logic gate LG1 can operate at voltages the same as the voltages which the driving power enhancement circuit 603 operates at. In one embodiment, the pre-driving circuit 600 may not comprise the inverters IV1, IV2 and the logic gate LG1.

The advantage of the architecture described in FIG. 5 is that the voltage transformed by the voltage level transforming circuit 601 may be affected to rise or fall at the time that the drive circuit 400 is turned on or off, thus affecting the operation of other circuits, or affecting the stability of the voltage endurance of the driving circuit 400. In the embodiment of FIG. 5 of the present invention, the transformed first transformed voltage Vt1 and the untransformed second input voltage Vin2 are used to operate the components in the pre-driving circuit 600. By this way, the components in the pre-driving circuit 600 and the components in the driving circuit 400 can have a safe cross voltage and can operate at a relatively stable voltage.

The pre-driving circuit 700 illustrated in FIG. 6 comprises a circuit structure the same as which of the pre-driving circuit 600 illustrated in FIG. 5. As illustrated in FIG. 6, the pre-driving circuit 700 comprises a voltage level transforming circuit 701 And a driving power enhancement circuit 703. The difference between the embodiment in FIG. 6 and the embodiment in FIG. 5 is that the voltage level transforming circuit 701 in the pre-driving circuit 700 is used to transform a second input voltage Vin2 into a first transformed voltage Vt2, and does not transform the first input voltage Vin1. In one embodiment, the first input voltage Vin1 is higher than the second input voltage Vin2, and the first transformed voltage Vt1 in the embodiment in FIG. 5 is higher than the second transformed voltage Vt2 in FIG. 6. The pre-driving circuit 700 and the driving circuit 400 can be regarded as an output stage circuit.

In the embodiment illustrated in FIG. 6, the driving power enhancement circuit 703 comprises inverters IV4-IV7 that operate at the first input voltage Vin1 and the second transformed voltage Vt2. In one embodiment, in addition to the voltage level transforming circuit 701 and the driving power enhancement circuit 703, the pre-driving circuit 700 may further comprise other inverters IV1, IV2 and a logic gate LG1. The inverters IV1, IV2 and the logic gate LG1 also operate at the first input voltage Vin1 and the second transformed voltage Vt2. In one embodiment, the pre-driving circuit 700 does not comprise inverters IV1, IV2 and logic gate LG1.

As mentioned above, the advantage of this architecture is that the voltage transformed by the voltage level transforming circuit 701 may be affected to rise or fall at the time that the drive circuit 400 is turned on or turned off, thus affects the operation of other circuits, or affects the stability of the voltage endurance of the driving circuit 400. In the embodiment of FIG. 6 of the present invention, the untransformed first input voltage Vin1 and the transformed second transformed voltage Vt2 are used to make the components in the pre-driving circuit 700 operate. By this way, the components in the pre-driving circuit 700 and the components in the driving circuit 400 can have a safe cross voltage and can operate at a relatively stable voltage.

The embodiments illustrated in FIG. 5 and FIG. 6 can be used in combination or independently. For example, in one embodiment, the driving power enhancement circuit 603 in FIG. 5 and the driving power enhancement circuit 703 in FIG. 6 may be independent circuits. In another embodiment, the driving power enhancement circuit 603 in FIG. 5 and the driving power enhancement circuit 703 in FIG. 6 are respectively the upper bridge circuit and the lower bridge circuit in the same pre-driving circuit.

Therefore, the embodiments described in FIGS. 5 and 6 can be briefly described as follows: a pre-driving circuit, comprising: a voltage level transforming circuit, configured to transform a first input voltage (e.g., Vin1) to a first transferred voltage (e.g., Vt1), or to transform a second input voltage (e.g., Vin2) to a second transferred voltage (e.g., Vt2), wherein the first input voltage is higher than the second input voltage, and the second transformed voltages than the first transferred voltage; and a driving power enhancement circuit, comprising at least one inverter(e.g., IV4-IV7), wherein the inverter operates at the first input voltage and the second transferred voltage, or operates at the first transformed voltage and the second input voltage.

Figure 7:
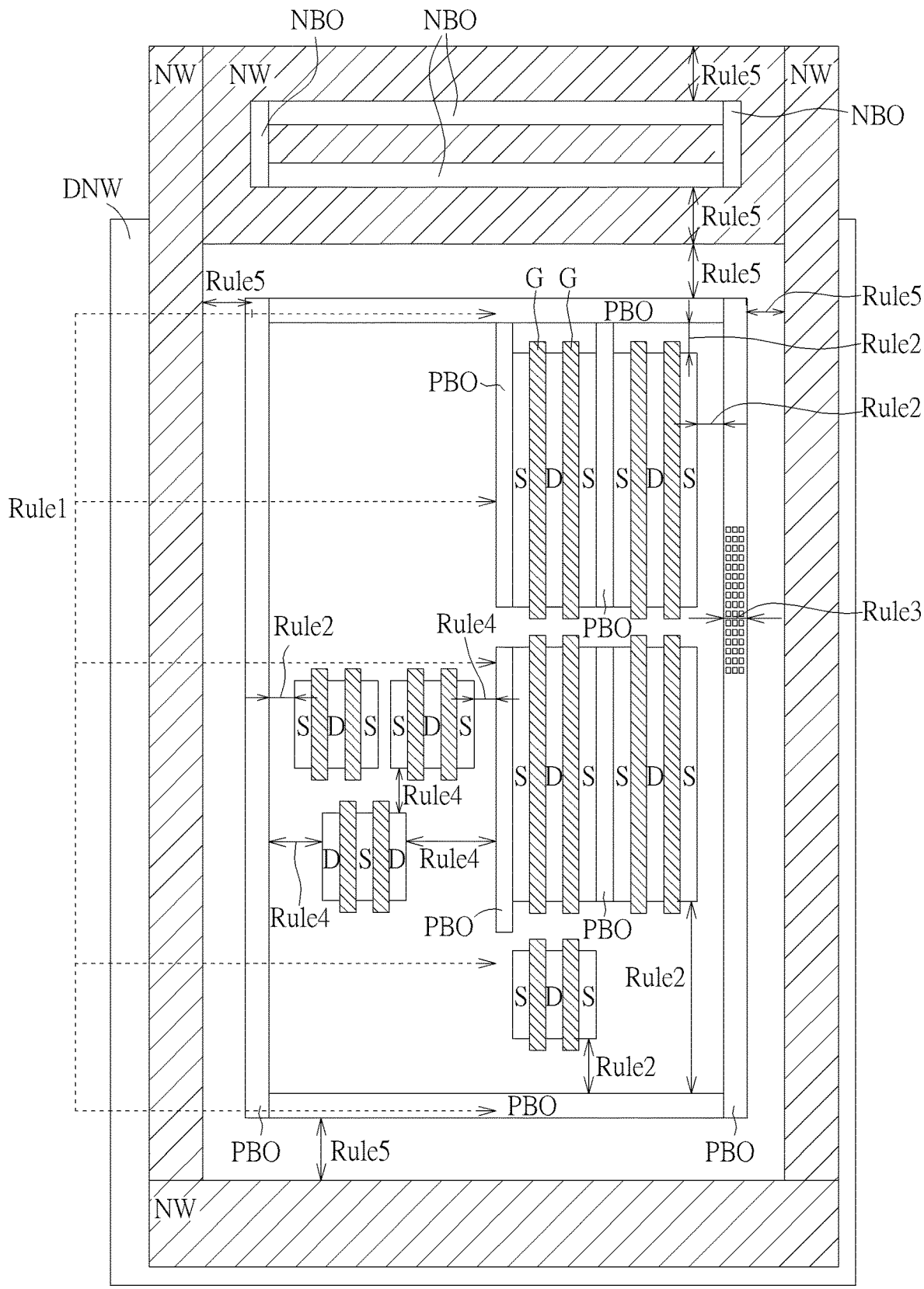
FIG. 7 is a schematic diagram illustrating IC layouts of the pre-driving circuits illustrated in FIG. 5 and FIG. 6.

In addition to the above-mentioned circuits, the present invention also provides an IC layout of the pre-driving circuit to further increase the stability of the circuit. FIG. 7 illustrates the IC layout of the pre-driving circuit illustrated in FIG. 5 and FIG. 6 according to an embodiment of the present invention. However, please note that the IC layout illustrated in FIG. 7 can also be used on other pre-driving circuits.

For the convenience of describing and understanding, the meaning of each component symbol illustrated in FIG. 7 is listed as below:

NW: N well region

DNW: Deep N well region

NBO: N bulk region, also called NTAP or N-body, N-butting.

PBO: P bulk region, also called PTAP or P-body, P-butting.

D: Drain region of the NMOS region.

S: Source region of the NMOS region.

G: Gate region of the NMOS region. Please also note that only partial of the gate region G is symbolized in the embodiment in FIG. 7. A drain region D, a source region S and a gate region G form an NMOS. In the embodiment in FIG. 7, one NMOS region comprises two NMOSs, but it is not limited.

CH: contact hole.

Please also note that in the embodiment of FIG. 7, the NMOS can be located in a P well region, which is located between the NMOS and the deep N well region but not shown.

Rule 1, Rule 2, Rule 3, Rule 4, Rule 5 means that the IC layout illustrated in FIG. 7 following these rules. For example, if Rule 3 is marked next to the contact hole CH, it means this part follows Rule 3. The contents of Rule 1, Rule 2, Rule 3, Rule 4, Rule 5 are described for more details as below:

Rule 1

The density of the NMOS region is less than a predetermined level, for example, not more than two rows. In addition, the P bulk region PBO completely surrounds the NMOS region. For example, in the embodiment illustrated in FIG. 7, the P bulk region PBO surrounds the NMOS region for a complete rectangle. The advantage of such rule is that it can increase the influence of the P bulk region PBO to the NMOS region, so as to reduce the generation of parasitic BJT effects.

Rule 1 can further extend the P bulk region PBO as illustrated in FIG. 7, so that the P bulk region PBO and the source region S are directly connected to further enhance the influence of the P bulk region PBO to the NMOS region.

Rule 2

The distance between the NMOS region and the P bulk region PBO is less than a maximum distance threshold (e.g., less than 2.27 um) and larger than a minimum distance threshold (e.g., larger than 0.5 um). The advantage of such rule is that if the NMOS region and the P bulk region PBO are too far away, the influence of the P bulk region PBO on the NMOS region is reduced, and the parasitic BJT effect easily occurs. On the contrary, if the NMOS region and the P bulk region PBO are too close, the NMOS voltage endurance decreases and the NMOS is easily to be damaged.

Rule 3

The region with the smallest width in the P bulk region PBO can accommodate three rows or more of contact holes CH, as illustrated in FIG. 7. Such structure can reduce the resistance and increase the grounding capability of the circuit.

Rule 4

An arrangement of the drain region D and the source region S of the NMOS region follows the rule of: source region S-drain region D-drain region D-source region S, such as the SDDS arrangement illustrated in FIG. 7. In addition, the distance between the source region S and the drain region D is larger than a predetermined threshold value, that is, the distance between the terminal regions with different voltage levels is larger than a predetermined threshold value. By this way, the terminal regions with different voltage levels can be prevented from interfering with each other and from affecting the voltage endurance.

Rule 5

The distance between the P bulk region PBO and the N well region NW is larger than a first predetermined threshold value, and the distance between the N bulk region NBO and the deep N well region DNW is larger than a second predetermined threshold. The first predetermined threshold value and the second predetermined threshold value may be the same or different. By this way, the parasitic BJT effect can be prevented. Please also note that a PMOS can be provided between the upper N bulk regions NBO and the lower N bulk regions NBO in FIG. 7, but it is not shown in this figure and is described in detail in FIG. 8.

Rule 6

In other embodiments, a PMOS region may be further comprised, and the deep N well region DNW overlaps partial of the N well region NW region but does not overlap with all or partial of the PMOS region.

Figure 8:
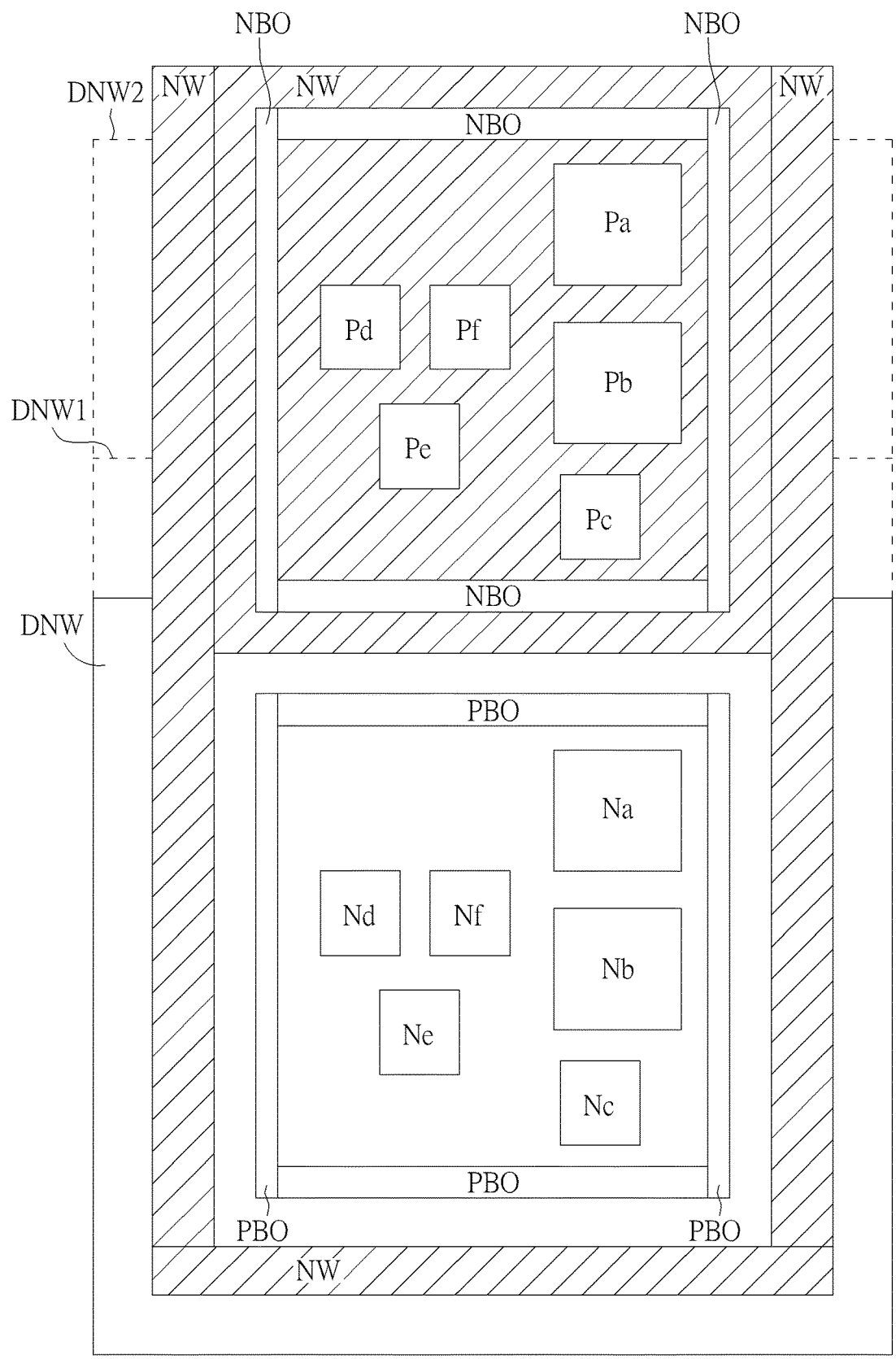
FIG. 8 is a schematic diagram illustrating the Rule 6 in FIG. 7, according to one embodiment of the present invention.

FIG. 8 is a schematic diagram illustrating the Rule 6 in FIG. 7, according to one embodiment of the present invention. Please note that in order to simplify the illustration, the PMOS region and the NMOS region in FIG. 8 are only illustrated by the simplified components: PMOSs region Pa . . . Pd and NMOS regions Na . . . Nd. The NMOS region Na . . . Nd may comprise the structure described in FIG. 7. For example, the NMOS region Na can have the structure of the NMOS region in the upper right region surrounded by the P bulk region PBO in FIG. 7, and the NMOS region Ne can comprise the structure of the NMOS region in the lower left region surrounded by the P bulk region PBO in FIG. 7. The PMOS region Pa . . . Pd is partly the same as the NMOS region Na . . . Nd. For more detail, the drain region D and source region S of the PMOS region Pa . . . Pd can be arranged the same as the drain region D and source region S of the NMOS region Na . . . Nd, but the P bulk region PBO is replaced by the N bulk region NBO and is located in the N well region NW rather than the P well region NW.

As illustrated in FIG. 8, the deep N well region DNW overlaps with partial of the N well region NW region but does not overlap with all or partial of the PMOS region. Specifically, the deep N well region DNW in FIG. 8 overlaps with the N well region NW but does not overlap with any one of the PMOS regions Pa . . . Pd, thus follows the Rule 6. However, if the deep N well region DNW extends to the dotted line of DNW1 in FIG. 8, it overlaps with the PMOS region Pc, which does not follow Rule 6. Similarly, if the deep N well region DNW extends to the dotted line of DNW2 in FIG. 8, it overlaps with the PMOS region Pa . . . Pd, which does not follow Rule 6.

Although the embodiment of FIG. 7 is illustrated with an IC layout of NMOS, it can also be applied to an IC layout of PMOS. As illustrated in FIG. 8, when applied to PMOS, polarities of partial of the regions are reversed. For example, the P well region PW becomes the N well region NW, and the P bulk region PBO becomes the N bulk region NBO. Therefore, the rules Rule 1, Rule 2, Rule 3, Rule 4, and Rule 5 of the embodiment in FIG. 7 can be illustrated as follows.

In addition, in the embodiment in FIG. 7, type one represents the N type, type two represents the P type, the first terminal region represents the drain region D, and the second terminal region represents the source region S. In another embodiment, when type one represents P type and type two represents N type, the first terminal region still represents the drain region D, and the second terminal region still represents the source region S.

Rule 1

The density of the type one transistor region is less than a predetermined level, for example, not more than two rows. Also, the type two bulk region completely surrounds these type one transistor regions.

Rule 1 can further extend the type two bulk region as illustrated in FIG. 7, so that the type two bulk region and the second terminal region are directly connected to further enhance the influence of the type two bulk region to the type one transistor regions.

Rule 2

The distance between the type one transistor region and the type two bulk region is less than a maximum distance threshold and larger than a minimum distance threshold.

Rule 3

The region with the smallest width in the type two bulk region can accommodate two rows or more of contact holes.

Rule 4

An arrangement of the first terminal region and the second terminal region of the type one transistor region follows the rule of: second terminal region—first terminal region—first terminal region—second terminal region. In addition, the distance between the first terminal region and the second terminal region is larger than a predetermined threshold value, that is, the distance between the terminal regions with different voltage levels is larger than a predetermined threshold value.

Rule 5

The distance between the type two bulk region and the type one well region is larger than a first predetermined threshold value, and the distance between the type one bulk region NBO and the type one deep well region is larger than a second predetermined threshold. The first predetermined threshold value and the second predetermined threshold value may be the same or different.

The above-mentioned embodiments can be used in combination or independently. For example, the pre-driving circuit illustrated in FIG. 5 and FIG. 6 may be electrically coupled to an ESD circuit, or comprise but not limited to the driving circuit 400 illustrated in FIG. 4. The ESD circuit, pre-driving circuit, and the driving circuit can use the aforementioned architecture, but other architectures can also be used.

In view of above-mentioned embodiments, the voltage endurance of the circuit components of the ESD protection circuit, and the circuit stability of the pre-driving circuit, the driving circuit or the overall output stage circuit can be enhanced, so that the problems in the prior art can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pre-driving circuit, comprising:
a voltage level transforming circuit, configured to transform a first input voltage to a first transformed voltage, or to transform a second input voltage to a second transformed voltage, wherein the first input voltage is higher than the second input voltage, and the second transformed voltage is less than the first transformed voltage; and
a driving power enhancement circuit, comprising at least one inverter, wherein the inverter operates at the first input voltage and the second transformed voltage, or operates at the first transformed voltage and the second input voltage.

2. The pre-driving circuit of claim 1, wherein the voltage level transforming circuit transfers the first input voltage to the first transformed voltage, and the inverter operates at the first transformed voltage and the second input voltage.

3. The pre-driving circuit of claim 2, further comprising at least one logic gate and at least one inverter which is different from the inverter of the driving power enhancement circuit, wherein the logic gate and the inverter which is different from the inverter of the driving power enhancement circuit are electrically coupled between the voltage level transforming circuit and the driving power enhancement circuit, and operate at the first transformed voltage and the second input voltage.

4. The pre-driving circuit of claim 1, wherein the voltage level transforming circuit transfers the second input voltage to the second transformed voltage, and the inverter operates at the first input voltage and the second transformed voltage.

5. The pre-driving circuit of claim 4, further comprising at least one logic gate and at least one inverter which is different from the inverter of the driving power enhancement circuit, wherein the logic gate and the inverter which is different from the inverter of the driving power enhancement circuit are electrically coupled between the voltage level transforming circuit and the driving power enhancement circuit, and operate at the first input voltage and the second transformed voltage.

6. The pre-driving circuit of claim 1, wherein the driving power enhancement circuit is electrically coupled to a driving circuit, wherein the driving circuit comprises:
a first type one transistor electrically coupled to a second voltage source;
a second type one transistor electrically coupled to the first type one transistor in series, and a control terminal of the second type one transistor is electrically coupled to the first voltage source; and
a first type two transistor electrically coupled between the first voltage source and the second type one transistor.

7. The pre-driving circuit of claim 6, wherein the first type one transistor and the second type one transistor are NMOSs when the first type two transistor is a PMOS, wherein the first type one transistor and the second type one transistor are PMOSs when the first type two transistor is an NMOS.

* * * * *